(12) United States Patent
Aggarwal

(10) Patent No.: US 10,036,963 B2
(45) Date of Patent: Jul. 31, 2018

(54) ESTIMATING A GAIN RELATIONSHIP OF AN OPTICAL SOURCE

(71) Applicant: Cymer, LLC, San Diego, CA (US)

(72) Inventor: Tanuj Aggarwal, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/262,452

(22) Filed: Sep. 12, 2016

(65) Prior Publication Data
US 2018/0074412 A1 Mar. 15, 2018

(51) Int. Cl.
G03B 27/54 (2006.01)
G03F 7/20 (2006.01)

(52) U.S. Cl.
CPC .................. G03F 7/70516 (2013.01)

(58) Field of Classification Search
CPC ............. G03F 7/70191; G03F 7/70041; G03F 7/70558; G03F 7/705; G03F 7/70508; G03F 7/70575; G03F 7/70516; H01S 3/1305; H01S 3/137
See application file for complete search history.

(56) References Cited

U.S. PATENT DOCUMENTS

| | | | | |
|---|---|---|---|---|
| 5,097,291 | A | * | 3/1992 | Suzuki ............... G03F 7/70558 355/53 |
| 6,458,605 | B1 | | 10/2002 | Stirton |
| 6,646,790 | B2 | | 11/2003 | Parry et al. |
| 6,741,041 | B2 | * | 5/2004 | Tateishi ................. G11B 7/126 315/224 |
| 8,242,472 | B2 | * | 8/2012 | Moriya ................. H01S 3/1305 250/492.1 |
| 8,254,420 | B2 | | 8/2012 | Riggs et al. |
| 8,326,340 | B2 | | 12/2012 | Nalbantis et al. |

(Continued)

FOREIGN PATENT DOCUMENTS

| | | |
|---|---|---|
| TW | I342469 B | 5/2011 |
| TW | I367321 B | 7/2012 |

OTHER PUBLICATIONS

Shane Thomas, U.S. International Searching Authority, International Search Report and Written Opinion, counterpart PCT Application No. PCT/US2017/047437, dated Oct. 27, 2017, 8 pages total.

(Continued)

Primary Examiner — Deoram Persaud
(74) Attorney, Agent, or Firm — DiBerardino McGovern IP Group LLC

(57) ABSTRACT

An indication of an output of an optical source of a photolithography system is accessed; an indication of an input provided to the optical source is accessed, the provided input being associated with the accessed indication of the output of the optical source; an output error is determined from an expected amount of output and the accessed indication of the output of the optical source; a local gain associated with the accessed indication of the input provided to the optical source is estimated; a gain error is determined from the estimated local gain and an expected local gain; a current value of one or more operating metrics of the optical source is estimated based on one or more of the output error and the gain error; and a gain relationship for the optical source is updated based on the estimated current value of the one or more operating metrics.

22 Claims, 9 Drawing Sheets

(56) References Cited

U.S. PATENT DOCUMENTS

| | | | |
|---|---|---|---|
| 8,811,440 B2* | 8/2014 | Sandstrom | H01S 3/1305 |
| | | | 372/10 |
| 9,261,794 B1* | 2/2016 | Ahlawat | H01S 3/22 |
| 9,357,625 B2* | 5/2016 | Tao | H05G 2/006 |
| 9,762,023 B2* | 9/2017 | Thornes | H01S 3/1305 |
| 2005/0226287 A1* | 10/2005 | Shah | G01J 11/00 |
| | | | 372/25 |
| 2006/0114440 A1* | 6/2006 | Sekigawa | G03F 7/70141 |
| | | | 355/69 |
| 2007/0035716 A1 | 2/2007 | Yoshii et al. | |
| 2007/0213697 A1* | 9/2007 | Holliday | A61F 9/008 |
| | | | 606/10 |
| 2008/0036991 A1* | 2/2008 | Heintze | G03F 7/70041 |
| | | | 355/69 |
| 2008/0117411 A1 | 5/2008 | Vuong et al. | |
| 2008/0198891 A1* | 8/2008 | Hori | H01S 3/036 |
| | | | 372/61 |
| 2008/0232408 A1* | 9/2008 | O'Brien | G03F 7/70575 |
| | | | 372/19 |
| 2010/0002213 A1 | 1/2010 | Kim et al. | |
| 2011/0317256 A1* | 12/2011 | Hou | H01S 3/076 |
| | | | 359/337.21 |
| 2013/0148674 A1* | 6/2013 | Nowak | H01S 5/06216 |
| | | | 372/26 |
| 2015/0070673 A1 | 3/2015 | Lalovic et al. | |
| 2015/0355025 A1 | 12/2015 | Duffey et al. | |
| 2017/0115575 A1* | 4/2017 | Aggarwal | G03F 7/70041 |

OTHER PUBLICATIONS

Office Action, counterpart Taiwanese Patent Application No. 106130715, dated May 4, 2018, 16 pages total (including English translation of 6 pages).

* cited by examiner

ESTIMATING A GAIN RELATIONSHIP OF AN OPTICAL SOURCE

TECHNICAL FIELD

This disclosure relates to estimating a gain relationship of an optical source. The optical source may be part of an optical lithography system.

BACKGROUND

Photolithography is the process by which semiconductor circuitry is patterned on a substrate such as a silicon wafer. A photolithography optical source provides the deep ultraviolet (DUV) light used to expose a photoresist on the wafer. DUV light for photolithography is generated by excimer optical sources. Often, the optical source is a laser source and the pulsed light beam is a pulsed laser beam. The light beam is passed through a beam delivery unit, a reticle or a mask, and then projected onto a prepared silicon wafer. In this way, a chip design is patterned onto a photoresist that is then etched and cleaned, and then the process repeats.

SUMMARY

In one general aspect, an indication of an output of an optical source of a photolithography system is accessed, the optical source being associated with a range of input values and a corresponding range of output values; an indication of an input provided to the optical source of the photolithography system is accessed, the provided input being associated with the accessed indication of the output of the optical source; an output error is determined from an expected amount of output and the accessed indication of the output of the optical source; estimating a local gain associated with the accessed indication of the input provided to the optical source; a gain error is determined from the estimated local gain and an expected local gain; estimating a current value of one or more operating metrics of the optical source based on one or more of the output error and the gain error; and a gain relationship for the optical source is updated based on the estimated current value of the one or more operating metrics, the gain relationship relating the range of input values to a corresponding range of expected output values.

Implementations may include one or more of the following features. The input values may include voltage values, the output values may include energy values, and the one or more operating metrics may include a minimum output energy and a maximum output energy, the minimum output energy being an amount of energy produced by the optical source in response to application of a minimum voltage input, the maximum output energy being an amount of energy produced by the optical source in response to application of a maximum input voltage.

The gain relationship may be a third-order polynomial defined by four coefficients, and a value for each of the four coefficients may be determined based on the accessed indication of the output of the optical source, the accessed indication of the output of the optical source, an assumed slope of the gain relationship at a maximum input of the optical source, an assumed minimum input value, an assumed maximum input value, and the estimated current value of the one or more operating metrics.

In some implementations, the expected amount of output may be determined from an initial gain relationship, the initial gain relationship may be a third-order polynomial defined by four coefficients; and a value for each of the four coefficients may be determined based on the accessed indication of the output of the optical source, the accessed indication of the output of the optical source, an assumed slope of the gain relationship at a maximum input of the optical source, the assumed minimum input value, the assumed maximum input value, and a known value of the one or more operating metrics. The known value of one or more operating metrics may be either an assumed value or a previously determined value.

The expected local gain may be determined from the initial gain relationship and the accessed indication of the input provided to the optical source. Determining the expected amount of local gain may include using a gain estimator, the gain estimator including a buffer configured to store gain data, the gain data may be a plurality of operating points of the optical source, each operating point including an input provided to the optical source and a corresponding output of the optical source.

Each of the plurality of operating points may include an amount of voltage provided to the optical source and a measured amount of energy at a sensor in a lithography exposure apparatus. Determining the expected amount of local gain using the gain estimator may include determining a slope of a line that represents a linear relationship between at least some of the voltage amounts and the corresponding amounts of measured energy stored in the buffer.

In some implementations, an input to provide to the optical source may be determined using the updated gain relationship; a signal that represents the determined input may be generated; and the generated signal may be provided to the optical source.

The accessed indication of the output may be filtered to generate a filtered output, and the accessed indication of an input may be filtered to generate a filtered input, and the output error may be determined based on the filtered output and the expected amount of output.

The optical source may be configured to emit a pulsed light beam, and the gain relationship may be updated for each pulse in a plurality of temporally successive pulses in the light beam.

In another general aspect, a method of controlling an optical source in a photolithography system includes receiving an indication of a measured value associated with an output metric of the optical source, the measured value being related to an energy in a pulse of light produced by the optical source; accessing a value of an operating metric associated with the optical source; estimating a relationship between the output metric and an input metric based on the indication of the measured value of the output metric and the value of the operating metric, the input metric being related to an amount of excitation applied to the optical source; determining an expected value of the output parameter from the estimated relationship; comparing the indication of the measured value and the expected value to determine an error metric; adjusting the value of the operating metric and the estimated relationship based on the determined error metric; adjusting a value of the input metric associated with the optical source based on the adjusted estimated relationship; and providing the adjusted value of the input metric to the optical source, where the estimated relationship between the output metric and the input metric is adjusted for each of a plurality of optical pulses emitted from the optical source, the plurality of pulses including at least some pulses that are temporally successive.

Implementations may include one or more of the following features. The output metric may include an energy of an optical pulse emitted from the optical source, and the input metric may include an amount of voltage configured to be applied to a component of the optical source. The indication of a measured energy of the beam may be an energy measured at a wafer exposed by a lithography exposure apparatus of the photolithography system, and the indication of the measured energy may be received from the lithography exposure apparatus. Accessing a value of an operating metric may include accessing a value of a minimum output energy and a maximum output energy, the minimum output energy being an amount of energy produced by the optical source in response to application of a minimum voltage input, the maximum output energy being an amount of energy produced by the optical source in response to application of a maximum input voltage.

In another general aspect, a photolithography system includes an optical source configured to emit a pulsed light beam; a lithography exposure apparatus including an optical system, the optical system being positioned to receive the pulsed light beam from the optical source at a first side of the optical system and to emit the pulsed light beam at a second side of the optical system; and a control system coupled to the optical source and the lithography exposure apparatus, the control system configured to: access a value of an operating metric associated with the optical source; estimate one or more parameters that define a relationship between an output metric and an input metric of the optical source based on the indication of the measured energy and the value of the operating metric; determine an expected value of the output metric from the relationship; compare the indication of the measured value and the expected value to determine an error metric; adjust the value of the operating metric and the gain relationship based on the determined error metric; adjust a value of the input metric associated with the optical source based on the adjusted gain relationship; and provide the adjusted value of the input metric to the optical source.

Implementations may include one or more of the following features. The input metric may include an amount of voltage, and the control system configured to apply the adjusted value of the input parameter to the optical source may include the control system being configured to provide a signal including information indicating the amount of voltage to be applied to a component of the optical source. The optical source may include electrodes and a gain medium, and the control system may be configured to provide a signal including information indicating the amount of voltage to be applied to the electrodes of the optical source. The lithography exposure apparatus may be configured to receive a wafer at the second side of the optical system and further including a sensor at the second side of the optical system of the lithography exposure apparatus, the sensor configured to measure an amount of optical energy at the second side of the optical system and to provide the indication of the measured amount of energy at the second side of the optical system to the control system.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Techniques for controlling an optical lithography system and/or an optical source in an optical lithography system are disclosed.

Figure 1B:
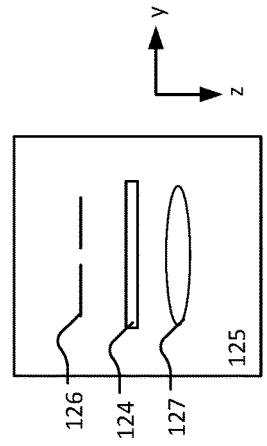
FIG. 1B is a block diagram of an example of a mask used in the photolithography system of FIG. 1A.
Figure 1A:
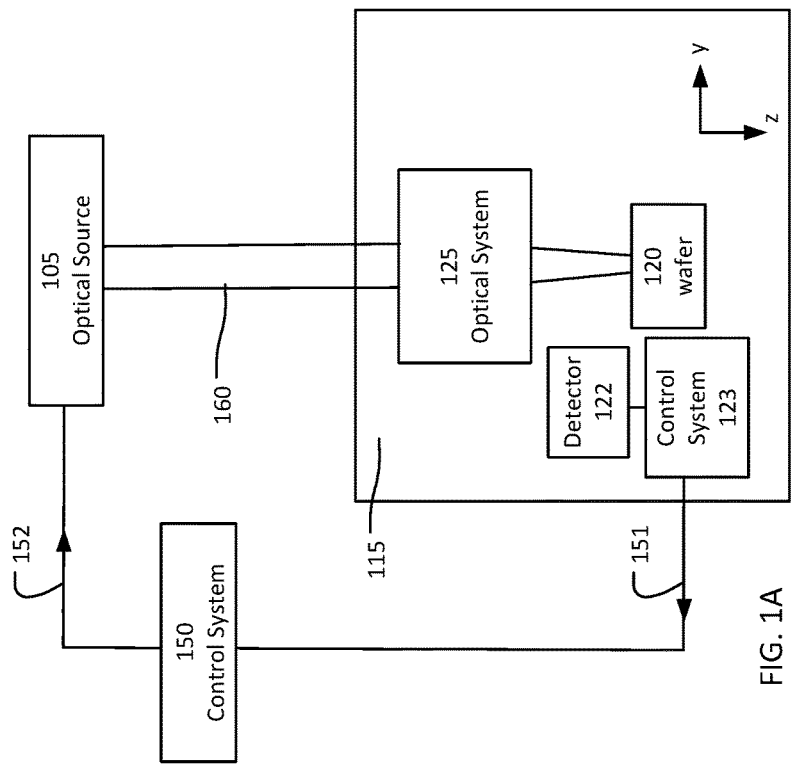
FIG. 1A is a block diagram of an example of a photolithography system.

Referring to FIG. 1A, a photolithography system 100 includes an optical (or light) source 105 that provides a light beam 160 to a lithography exposure apparatus 115, which processes a wafer 120. The light beam 160 is a pulsed light beam that includes pulses of light separated from each other in time. The lithography exposure apparatus 115 includes a projection optical system 125 through which the light beam 160 passes prior to reaching the wafer 120, and a detector 122. The detector 122 may be, for example, a camera or other device that is able to capture an image of the wafer 120 or the light beam 160 at the wafer 120, or an optical detector that is able to capture data that describes characteristics of the beam 160, such as intensity of the beam 160 at the wafer 120 in the x-y plane. The lithography exposure apparatus 115 may be a liquid immersion system or a dry system.

The photolithography system 100 includes a control system 150. The control system 150 receives a signal 151 from a control system 123, which is part of the lithography exposure apparatus 115 in the example of FIG. 1A, and generates a signal 152. The signal 152 is provided to the optical source 105 to control the operation of the optical source 105. The control system 123 receives data from the detector 122 and generates the signal 151 based on the data. In the example of FIG. 1A, the control system 123 is separate from the control system 150. However, in other implementations, the control system 123 and the control system 150 may be implemented in a single control system that is coupled to the lithography exposure apparatus 115 and the optical source 105.

The optical source 105 produces the light beam 160 in response to receiving a signal 152 from the control system 150. The signal 152 may include a component or aspect that determines an input to the optical source 105. For example, the optical source 105 may produce the light beam 160 in response to a voltage being applied to electrodes in the optical source 105, and the signal 152 may include data or information that specifies the amount of voltage to apply to the electrodes. The relationship between the output of the optical source 105 (for example, the energy in a pulse of the light beam 160) and the input to the optical source 105 that produced the output (for example, the amount of voltage that is applied to the electrodes) is expressed by a gain relationship. The gain relationship for the optical source 105 is non-linear. In other words, the input and the output of the optical source 105 are not proportional to each other over the full range of possible inputs. In addition to being non-linear, the gain relationship of the optical source 105 changes over time. Thus, a nominal or default gain relationship of the optical source 105 may be insufficient to provide real-time (for example, while the optical source 105 produces light) and accurate compensation for the non-linearity of the optical source 105.

As discussed in greater detail below, the control system 150 estimates the gain relationship of the optical source in real-time with an adaptive model and uses the estimated gain relationship to compensate for the non-linearity of the optical source 105. Data and/or information related to the optical source 105, such as the value of the input provided by the input signal 152, and the value of the output, such as the energy of the light beam 160, are measured or otherwise obtained while the optical source 105 produces the beam 160. The measured values are used by the adaptive model to determine an estimate of the gain relationship and/or to update an existing estimate of the gain relationship, allowing the non-linearity of the optical source 105 to be compensated. Additionally, the adaptive model leverages information about the typical behavior of the optical source such that the gain relationship can be estimated using only the nominally available measurements, that is, without exciting the source beyond the nominal operating range of inputs.

Microelectronic features are formed on the wafer 120 by, for example, exposing a layer of radiation-sensitive photoresist material on the wafer 120 with the light beam 160. Referring also to FIG. 1B, the projection optical system 125 includes a slit 126, a mask 124, and a projection lens 127. After reaching the projection optical system 125, the light beam 160 passes through the slit 126. In the example of FIGS. 1A and 1B, the slit 126 is rectangular and shapes the light beam 160 into an elongated rectangular shaped light beam. This shaped light beam then passes through the mask 124. A pattern is formed on the mask 124, and the pattern determines which portions of the shaped light beam are transmitted by the mask 124 and which are blocked by the mask 124. The design of the pattern is determined by the specific microelectronic circuit design that is to be formed on the wafer 120. The portions of the shaped light beam that are transmitted by the mask 124 pass through (and may be focused by) the projection lens 127 and expose the wafer 120.

The amount of energy delivered to the wafer 120 by the light beam 160 per unit area over an exposure time (or a particular number of pulses of the light beam 160) is referred to as the dose or the exposure energy (for example, in units of Joules). The formation of the micro-electronic features on the wafer 120 depends on the proper dose (a "target dose") reaching the wafer 120. If too little energy reaches the wafer 120 over the exposure time (the dose is too low and is less than the target dose), the radiation-sensitive material of the wafer 120 is not activated and the micro-electronic features are not formed or are incompletely formed on the wafer 120. If too much energy reaches the wafer 120 over the exposure time (the dose is too high and is greater than the target dose), the radiation-sensitive material of the wafer 120 can be exposed outside of the bounds of the image of the slit pattern and the micro-electronic features are improperly formed on the wafer 120. Thus, minimization or reduction of dose error, which is a difference between the dose and the target dose, and control of the dose error within an acceptable range, is important to the accurate and efficient performance of the photolithography system 100.

The non-linearity of the gain relationship of the optical source 105 may lead to various performance challenges for the optical source 105 and/or the photolithography system 100. The control system 150 compensates for the non-linearity and improves the performance of the optical system 100 and/or the optical source 105 in several ways. For example, the control system 150 may improve the stability of the exposure process and improve the control of the dose. During operation of the optical system 100, the lithography exposure apparatus 115 may request a particular amount of optical energy from the source 105. The control system 150 estimates the gain relationship and the maximum amount of energy that the optical source 105 is able to produce in real-time. If the lithography exposure apparatus 115 anticipates that the beam 160 will provide more optical energy than is actually received, the exposure process may become unstable and/or the dose error may increase. The control system 150 may reduce or prevent negative effects of a mismatch between the requested energy and the amount of energy received. For example, if the lithography exposure apparatus 115 requests an amount of optical energy that is greater than what the optical source 105 is able to produce, the control system 150 may provide a signal to the control system 123 that includes data indicating an amount that actually will be received at the lithography exposure apparatus 115. In addition, the control system 123 may optimize its control parameters to stay within the achievable range of energy thereby preventing the possibility of instability.

Furthermore, the control system 150 may provide a more accurate estimate of the gain relationship and also may provide the estimate more quickly as compared to systems that lack a control system with the features of the control system 150. For example, in lithography systems that lack the control system 150, the lithography exposure apparatus 115 may estimate the gain of the optical source 105 by sending a dither signal to the optical source 105. The dither signal does not encompass the full range of inputs. Because the gain of the optical source 105 is nonlinear, the gain determined by the dither signal is not accurate for the full range of inputs that the optical source 105 may receive. By compensating for the nonlinearity of the gain of the optical source 105 in real-time and with (or without) the use of a dither signal, the control system 150 avoids the potential issue of inaccurate calibration by the lithography exposure apparatus 115. Additionally, a small amplitude dither signal may be challenging to analyze in the presence of noise that is also present in the system 100. Thus, estimating the gain relationship with a dither signal alone may be slow. Using a larger amplitude dither signal may impact dose performance. The control system 150 provides a faster gain estimate with less or no impact on dose performance.

Additionally, by compensating for the nonlinearity of the optical source 105, the control system 150 causes the optical source 105 to act as a linear system relative to the lithography exposure apparatus 115. As a result, the actual dose performance of the lithography exposure apparatus 115 may be matched to the expected or theoretical dose performance.

Before discussing the control system 150 in more detail with respect to FIGS. 4-8, an exemplary photolithography system 200 is discussed.

Figure 2:
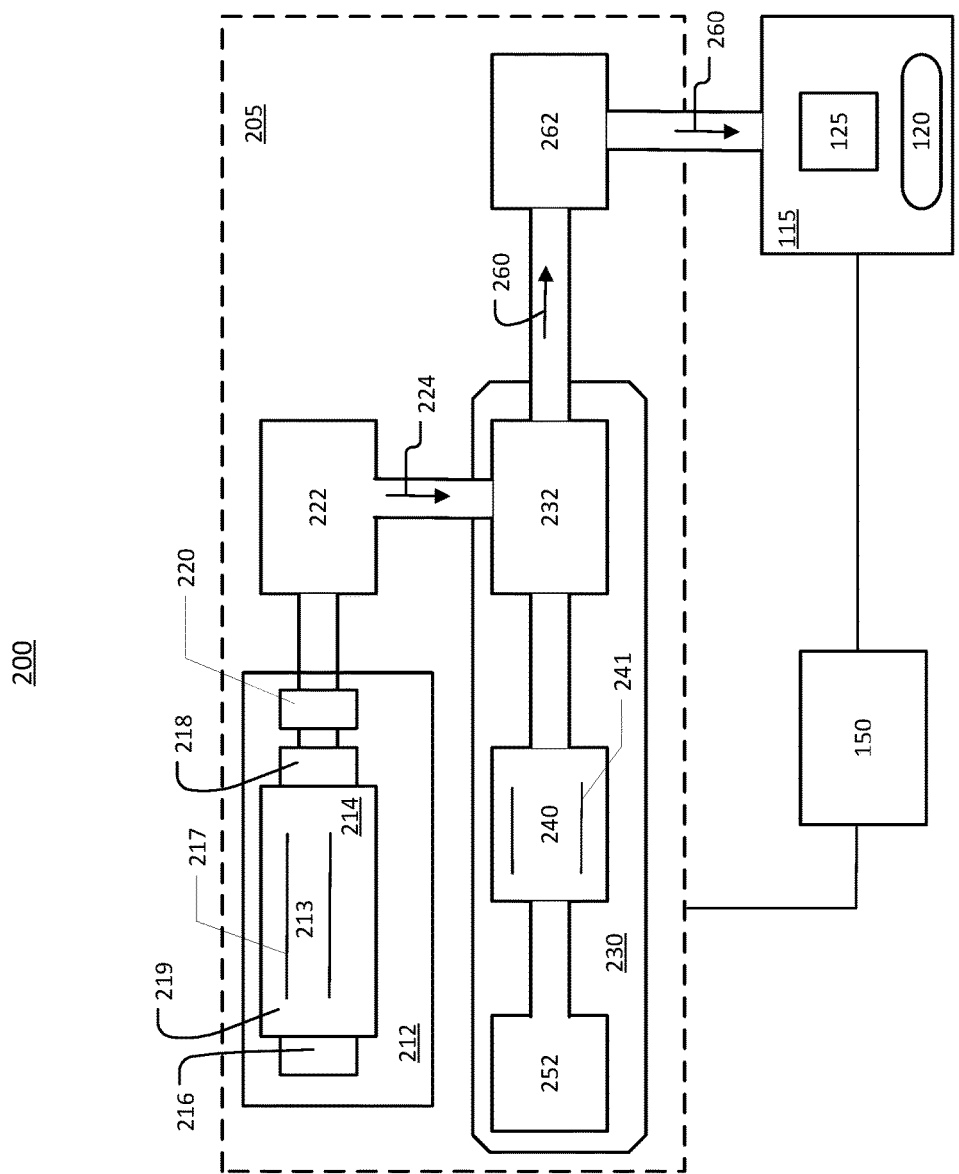
FIG. 2 is a block diagram of another exemplary photolithography system.

Referring also to FIG. 2, a block diagram of an exemplary photolithography system 200 is shown. In the photolithography system 200, an exemplary optical source 205 is used as the optical source 105 (FIG. 1). The optical source 205 produces a pulsed light beam 260, which is provided to the lithography exposure apparatus 115. The optical source 205 may be, for example, an excimer optical source that outputs the pulsed light beam 260 (which may be a laser beam). As the pulsed light beam 260 enters the lithography exposure apparatus 115, it is directed through the projection optical system 125 and projected onto the wafer 120. In this way, one or more microelectronic features is patterned onto a photoresist on the wafer 120 that is then etched and cleaned, and the process repeats. The photolithography system 200 also includes the control system 150, which, in the example of FIG. 2, is connected to components of the optical source 205 as well as to the lithography exposure apparatus 115 to control various operations of the system 200.

In the example shown in FIG. 2, the optical source 205 is a two-stage laser system that includes a master oscillator (MO) 212 that provides a seed light beam 224 to a power amplifier (PA) 230. The power amplifier 230 receives the seed light beam 224 from the master oscillator 212 and amplifies the seed light beam 224 to generate the light beam 260 for use in the lithography exposure apparatus 115. For example, the master oscillator 212 may emit a pulsed seed light beam, with seed pulse energies of approximately 1 milliJoule (mJ) per pulse, and these seed pulses may be amplified by the power amplifier 230 to about 10 to 15 mJ.

The master oscillator 212 includes a discharge chamber 240 having two elongated electrodes 217, a gain medium 219 that is a gas mixture, and a fan for circulating gas between the electrodes 217. A resonator is formed between a line narrowing module 216 on one side of the discharge chamber 240 and an output coupler 218 on a second side of the discharge chamber 240. The line narrowing module 216 may include a diffractive optic such as a grating that finely tunes the spectral output of the discharge chamber 240. The master oscillator 212 also includes a line center analysis module 220 that receives an output light beam from the output coupler 218 and a beam coupling optical system 222 that modifies the size or shape of the output light beam as needed to form the seed light beam 224. The line center analysis module 220 is a measurement system that may be used to measure or monitor the wavelength of the seed light beam 224. The line center analysis module 220 may be placed at other locations in the optical source 205, or it may be placed at the output of the optical source 205.

The gas mixture used in the discharge chamber 240 may be any gas suitable for producing a light beam at the wavelength and bandwidth required for the application. For an excimer source, the gas mixture may contains a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam coupling optical system 232 that receives the seed light beam 224 from the master oscillator 212 and directs the light beam through a discharge chamber 240, and to a beam turning optical element 252, which modifies or changes the direction of the seed light beam 224 so that it is sent back into the discharge chamber 240. The discharge chamber 240 includes a pair of elongated electrodes 241, a gain medium 219 that is a gas mixture, and a fan for circulating the gas mixture between the electrodes 241.

The output light beam 260 is directed through a bandwidth analysis module 262, where various parameters (such as the bandwidth or the wavelength) of the beam 260 may be measured. The output light beam 260 may also be directed through a pulse stretcher, where each of the pulses of the output light beam 260 is stretched in time, for example, in an optical delay unit, to adjust for performance properties of the light beam that impinges the lithography exposure apparatus 115.

Figure 3:
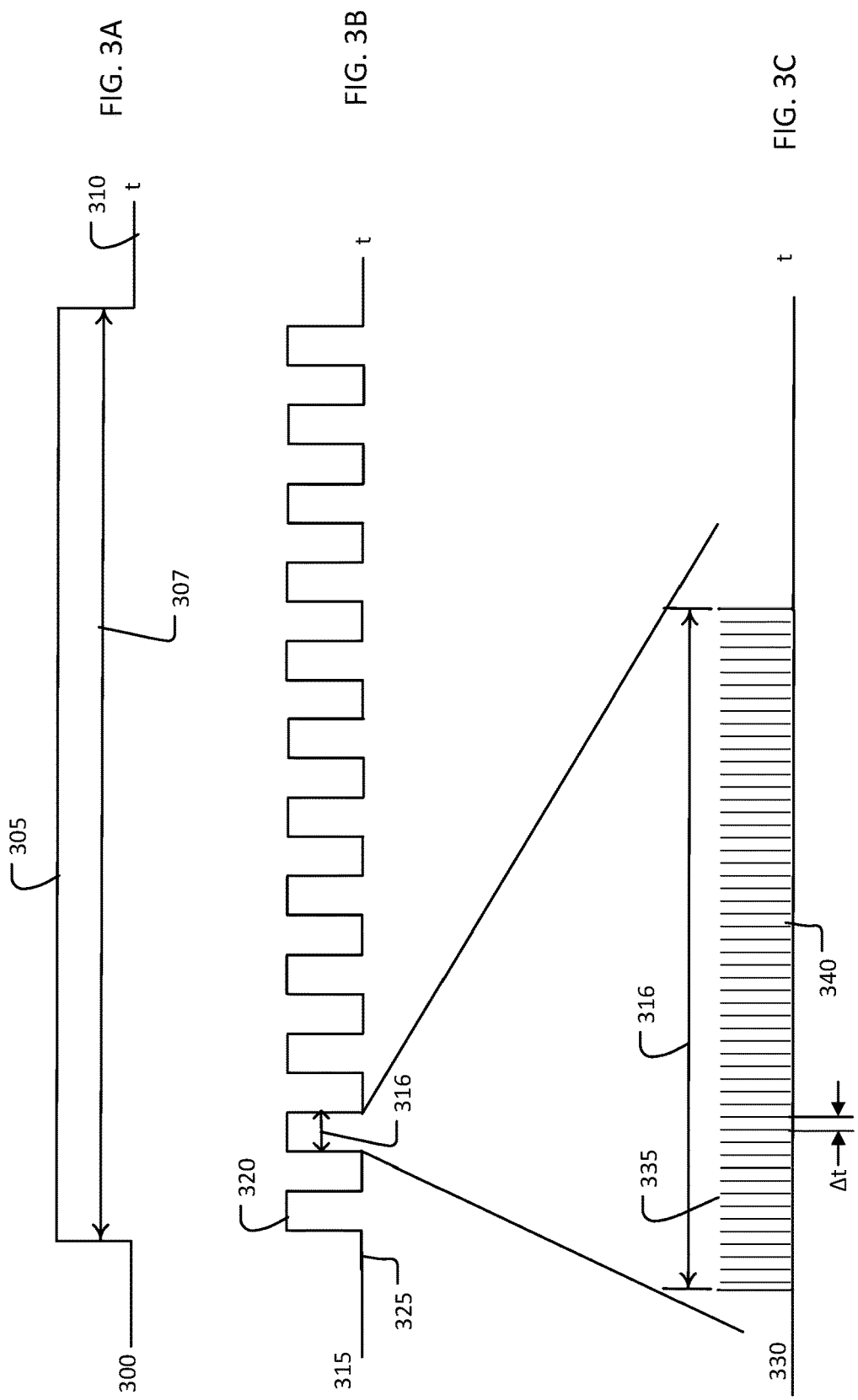
FIGS. 3A, 3B, and 3C are graphs of examples of signals that are used to control an optical source that is part of a photolithography system.

The control system 150 may be connected to various components of the optical source 205. For example, the control system 150 may control when the optical source 205 emits a pulse of light or a burst of light pulses that includes one or more pulses of light by sending one or more signals to the optical source 205. The light beam 260 may include one or more bursts that are separated from each other in time. Each burst may include one or more pulses of light. In some implementations, a burst includes hundreds of pulses, for example, 100-400 pulses. FIGS. 3A-3C provide an overview of the production of pulses in the optical source 205. FIG. 3A shows amplitude of a wafer exposure signal 300 as a function of time, FIG. 3B shows an amplitude of a gate signal 315 as a function of time, and FIG. 3C shows an amplitude of a trigger signal as a function of time.

The control system 150 may be configured to send the wafer exposure signal 300 to the optical source 205 to control the optical source 205 to produce the light beam 260. In the example shown in FIG. 3A, the wafer exposure signal 300 has a high value 305 (for example, 1) for a period of time 307 during which the optical source 205 produces bursts of pulses of light. The wafer exposure signal 300 otherwise has a low value 310 (for example, 0) when the wafer 120 is not being exposed.

Referring to FIG. 3B, the light beam 260 is a pulsed light beam, and the light beam 260 includes bursts of pulses. The control system 150 also controls the duration and frequency of the bursts of pulses by sending a gate signal 315 to the optical source 205. The gate signal 315 has a high value 320 (for example, 1) during a burst of pulses and a low value 325 (for example, 0) during the time between successive bursts. In the example shown, the duration of time at which the gate signal 315 has the high value is also the duration of a burst 316.

Referring to FIG. 3C, the control system 150 also controls the repetition rate of the pulses within each burst with a trigger signal 330. The trigger signal 330 includes triggers 340, one of which is provided to the optical source 205 to cause the optical source 205 to produce a pulse of light. The control system 150 may send a trigger 340 to the source 205 each time a pulse is to be produced. Thus, the repetition rate of the pulses produced by the optical source 205 (the time between two immediately adjacent pulses) may be set by the trigger signal 330. In the example of FIG. 3C, the time between two immediately adjacent pulses is the time between two immediately adjacent triggers, and is shown as Δt.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The pulse of light propagates through the gain medium 219 and exits the chamber 214 through the output coupler 218. Thus, a train of pulses is created by periodic, repeated application of voltage to the electrodes 217. The trigger signal 330, for example, may be used to control the application of voltage to the electrodes 217 and the repetition rate of the pulses, which may range between about 500 and 6,000 Hz for most applications. In some implementations, the repetition rate may be greater than 6,000 Hz, and may be, for example, 12,000 Hz or greater The signals from the control system 150 may also be used to control the electrodes 217, 241 within the master oscillator 212 and the power amplifier 230, respectively, for controlling the respective pulse energies of the master oscillator 212 and the power amplifier 230, and thus, the energy of the light beam 260. The repetitively-pulsed light beam 260 may have an average output power in the range of tens of watts, for example, from about 50 W to about 130 W. The irradiance (that is, the average power per unit area) of the light beam 260 at the output may range from 60 W/cm$^2$ to 80 W/cm$^2$. The amount of energy produced by the optical source 205 may be adjusted by changing the amount of voltage applied to the electrodes 217 and/or the electrodes 241. The relationship between the amount of energy in a pulse produced by the optical source and the voltage applied to the electrodes 217 and/or the electrodes 241 is nonlinear.

Figure 4:
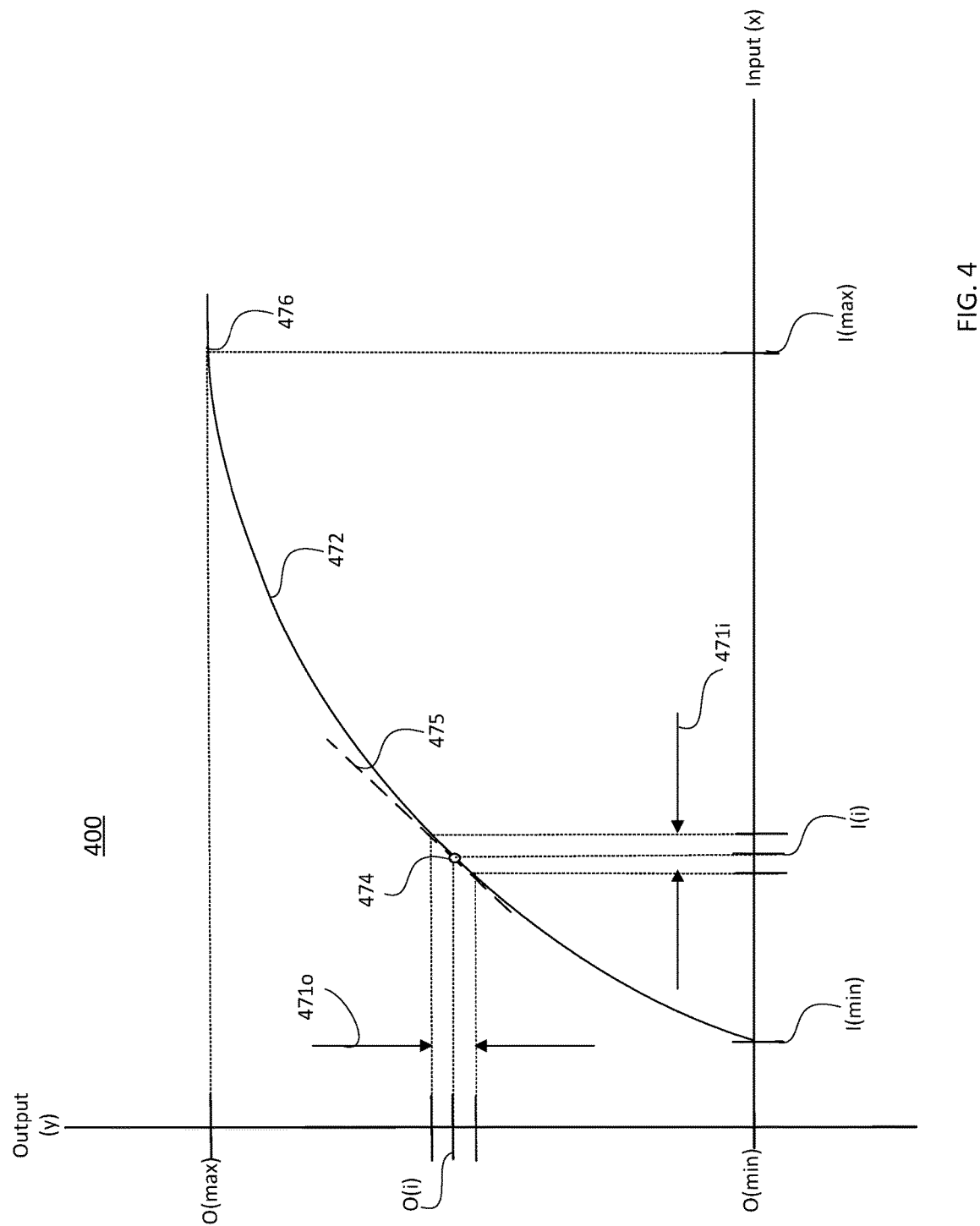
FIGS. 4, 7A, and 7B are plots of exemplary gain relationships.

Referring also to FIG. 4, a graph 400 shows an exemplary gain relationship 472 relating the input and output of an optical system. The optical system may be, for example, the master oscillator 212 and/or the power amplifier 230, or the optical source 205. The output of the optical system may be, for example, optical energy produced by the master oscillator 212 and/or the power amplifier 230, or the optical energy produced by the optical source 205 (which includes the master oscillator 212 and the power amplifier 230). The input may be, for example, an amount of voltage applied to the electrodes 217 and/or the electrodes 241.

The optical system has a range of inputs from I(min) to I(max), as shown on the x axis in FIG. 4. The range of inputs has a corresponding range of outputs from O(min) to O(max), as shown on the y axis in FIG. 4. The minimum output, O(min), is the output of the optical system produced at the minimum input, I(min), and the maximum output, O(max), is the output produced by the optical system in response to the application of the maximum input, I(max). The gain relationship 472 is nonlinear. In other words, the output of the optical system does not change linearly with the input to the optical system. The control system 150 compensates for the non-linearity of the gain relationship 472, as discussed below.

To produce a pulse of light i, an input I(i) (for example, a voltage) is applied to the optical system. The optical system produces an output O(i) in response. The output O(i) may be an amount of optical energy in a pulse of light i produced by the optical system. To produce the pulse of light i, the optical system operates at an operating point 474, which is defined by a value of the input, I(i), and a value of the output, O(i). In the vicinity of the operating point 474, the gain relationship 472 has a local slope 475. The local slope 475 is a slope of the gain relationship 472 over a range of inputs 471$i$ and outputs 471$o$. The local slope 475 is of a sufficiently small portion of the gain relationship 472 such that the local slope 475 is linear. For example, the slope 475 may be determined using measurements that make up 10% or less of the entire input range. As discussed below with respect to FIG. 6, the slope 475 is determined from measurements of the output for a range of inputs about the operating point 474. Because the gain relationship 472 is nonlinear, the slope of the gain relationship 472 may be different in the vicinity of other operating points. Additionally, the slope of the gain relationship 472 may be assumed to be known at certain operating points due to the properties of the optical system. For example, the optical system reaches saturation when the maximum input is provided. Thus, the slope of the gain relationship 472 is zero at the maximum input (shown as an operating point 476 in FIG. 4).

As discussed below, control system 150 estimates the gain relationship 472 based on a relatively limited amount of measured information. The gain relationship 472 may change over time and may be updated as the optical system produces light. For example, the gain relationship 472 may be updated for each pulse produced by the optical system. In this way, the control system 150 adapts to changes in the gain relationship 472 and improves the performance of an optical source and/or a lithography system that includes the optical system. Additionally, different optical systems may have different gain relationships. Because the control system 150 estimates and determines the gain relationship 472 during operation of the optical system, the control system 150 is not limited to use with a particular optical system or a particular type of optical system. The control system 150 estimates the gain relationship 472 during operation of the optical system using a relatively small amount of measured data and assumptions based on the known behavior of the optical system.

Figure 5:
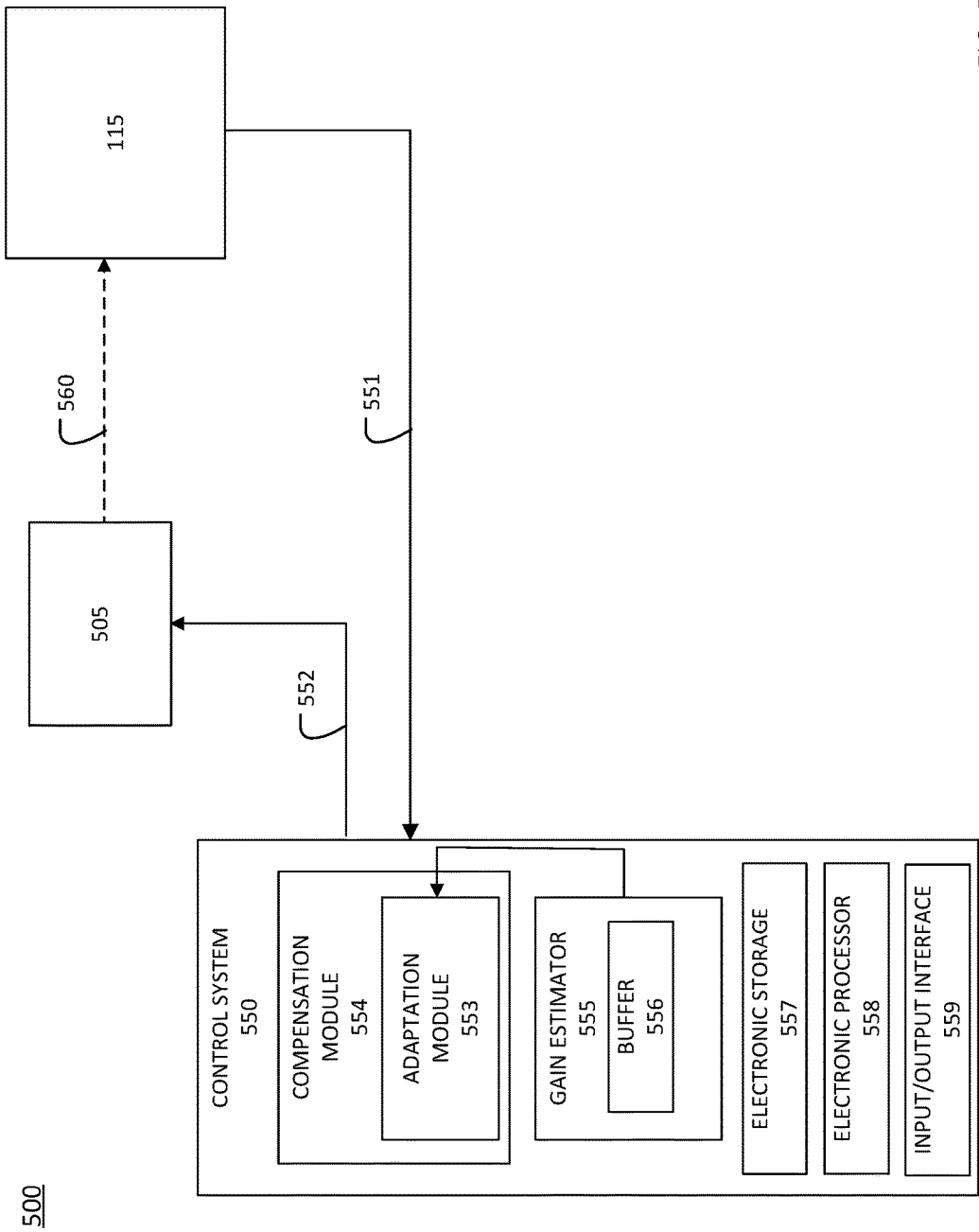
FIG. 5 is a block diagram of an exemplary photolithography system.

Referring to FIG. 5, a block diagram of an exemplary optical lithography system 500 is shown. The system 500 includes an optical source 505, which provides a pulsed light beam 560 (represented by a dashed line) to the lithography exposure apparatus 115. The optical source 505 may be similar to the optical sources 105 and 205, or the optical source 505 may be a component of the optical source 205. For example, the optical source 505 may be either of the master oscillator 212 or the power amplifier 230. The optical source 505 has a non-linear gain relationship (such as the non-linear gain relationship 472 of FIG. 4). A control system 550 provides an input signal 552 to the optical source 505, and the optical source 505 produces the beam 560 in response to the input signal 552. The optical source 505 produces the pulsed light beam 560 in accordance with information and/or data in the input signal 552.

After the (i–1)$^{th}$ pulse passes through the lithography exposure apparatus 115, the control system 550 receives a control signal 551(i–1) from the control system 123 of the lithography exposure apparatus 115. The control signal 551(i–1) includes information that indicates an energy target for the optical source 505, and the control signal 551(i–1) also may include information indicating an amount of measured energy at the lithography exposure apparatus 115 or between the optical source 505 and the apparatus 115. The energy target is the desired amount of energy for the wafer exposure process. The control system 550 processes the control signal 551(i–1) and determines an amount of voltage that, when applied to the optical source 505, would produce a pulse of light having the desired amount of energy. The control system 550 generates a control signal 552(i) based on the determined voltage and provides the signal 552 to the optical source 505. The signal 552 contains information that is sufficient to cause a voltage source or other mechanism at the optical source 505 to apply a voltage of the specified amount to the electrodes. In response to the excitation of the electrodes, the optical source 505 generates a pulse i of the beam 560. The pulse i propagates to the lithography exposure apparatus 115.

After the beam 160 propagates to the lithography exposure apparatus 115, the actual amount of energy at the lithography exposure apparatus 115 is measured (for example, by the detector 122). The control system 123 generates a control signal 551(i) that includes information that indicates the measured amount of energy in the pulse i.

The control signal 551(i) also may include additional information, such as a target energy. The target energy indicated by the control signal 551(i) may be the same or different than the target energy indicated by the control signal 551(i−1). Instances of the control signals 551 and 552 continue to be provided while the system 100 operates and may be provided for each pulse produced by the optical source 505.

The control system 550 includes a compensation module 554 and a gain estimator 555, which includes a buffer 556. The compensation module 554 includes an adaptation module 553. The compensation module 554 models the gain relationship of the optical source 505 with a third-order polynomial, shown in Equation (1):

$$E(V)=aV^3+bV^2+cV+d \quad \text{Equation (1),}$$

where E is an estimate of the output (for example, the optical energy in a pulse of light) of the optical source 505, V is the input to the optical source 505 (for example, a voltage applied to the electrodes of an optical system in the optical source 505), and a, b, c, and d are coefficients of the third-order polynomial with values that are initially unknown. As discussed below with respect to FIG. 6, V may be a voltage that has been low-pass filtered. The values of the coefficients a, b, c, and d are determined from assumptions based on known properties and behaviors of the optical source 505 and measured values. For example, four equations based on assumptions and measured values may be solved to provide estimates of the values of the coefficients a, b, c, and d. The four equations may be the Equations (2)-(5) discussed below, beginning with Equation 2:

$$E(V_m)=E_m \quad \text{Equation (2).}$$

In Equation, $E_m$ and $V_m$ are measured values, with $E_m$ being an energy produced by the optical system in response to the voltage $V_m$ being applied to the optical system. $E_m$ may be an average of the produced energy over many pulses, and $V_m$ may be the average value of the applied voltage to produce those pulses. Using average values may minimize or reduce the effect of noise on the estimates of the values of the coefficients a, b, c, and d. Together, $V_m$ and $E_m$ represent a measured operating point of the optical system. For example, $E_m(i)$ is the energy in pulse i, and $V_m(i)$ is the voltage applied to the optical system to produce pulse i. Equations (3)-(5) are as follows:

$$E(V_{min})=E_{min} \quad \text{Equation (3),}$$

where $E_{min}$ is the energy produced by the optical source 505 when the least amount of voltage is applied to the electrodes, $$E(V_{max})=E_{max} \quad \text{Equation (4),}$$

where $E(V_{max})$ is the energy produced by the optical source 505 when the highest possible voltage is applied to the electrodes, $$\frac{dE}{dV}=S, \quad \text{Equation (5)}$$

where s is the slope of the gain relationship at the highest possible voltage. The slope of the gain relationship is assumed to be known at $V_{max}$. For example, the slope of the gain relationship may be assumed to be zero at $V_{max}$. The assumed slope may be a parameter that is calibrated once (for example, when the optical source 505 is manufactured or installed at a customer site) or a parameter that is determined periodically for the optical source 505 (for example, each time the optical source 505 is serviced or at pre-determined and periodic temporal intervals). Thus, s in Equation (5) is assumed to be zero. In Equations (3) and (4), $V_{min}$ and $V_{max}$ are fixed values that represent the limits of the voltage that may be applied to the optical system. The values of $V_{min}$ and $V_{max}$ may be assumed based on properties of the optical source 505. $E_{min}$ and $E_{max}$ represent the amount of energy produced by the optical source 505 when a voltage of $V_{min}$ and $V_{max}$, respectively, is applied to the electrodes. Equations (2)-(5) are solved to determine the values of the unknown coefficients a, b, c, and d. Any error between the output energy measured at a given input voltage and the energy predicted by the compensation module 554 is used to estimate the gain relationship of the optical system, as discussed in greater detail with respect to FIG. 6.

The gain estimator 555 includes a buffer 556. The control system 550 also includes an electronic storage 557, an electronic processor 558, and an input/output interface 559. In some implementations, the buffer 556 is part of the electronic storage 557. The buffer 556 may store measured data, such as the measured energy produced in response to an input voltage.

The electronic processor 558 includes one or more processors suitable for the execution of a computer program such as a general or special purpose microprocessor, and any one or more processors of any kind of digital computer. Generally, a processor receives instructions and data from a read-only memory or a random access memory or both. The electronic processor 558 may be any type of electronic processor.

The electronic storage 557 may be volatile memory, such as RAM, or non-volatile memory. In some implementations, and the electronic storage 557 may include both non-volatile and volatile portions or components. The electronic storage 557 stores instructions, perhaps as a computer program, that, when executed, cause the processor 558 to communicate with other components in the control system 550, the lithography exposure apparatus 115, and/or the optical source 505. For example, the instructions may be instructions to cause the electronic storage 557 to store measured voltage and energy values in the buffer 556. The instructions may be instructions that cause the electronic processor 558 to analyze the stored data and generate a voltage signal based on the stored data.

The I/O interface 559 is any kind of electronic interface that allows the control system 550 to receive and/or provide data and signals with an operator, the optical source 505, and/or an automated process running on another electronic device. For example, the I/O interface 559 may include one or more of a visual display, a keyboard, or a communications interface.

Figure 6:
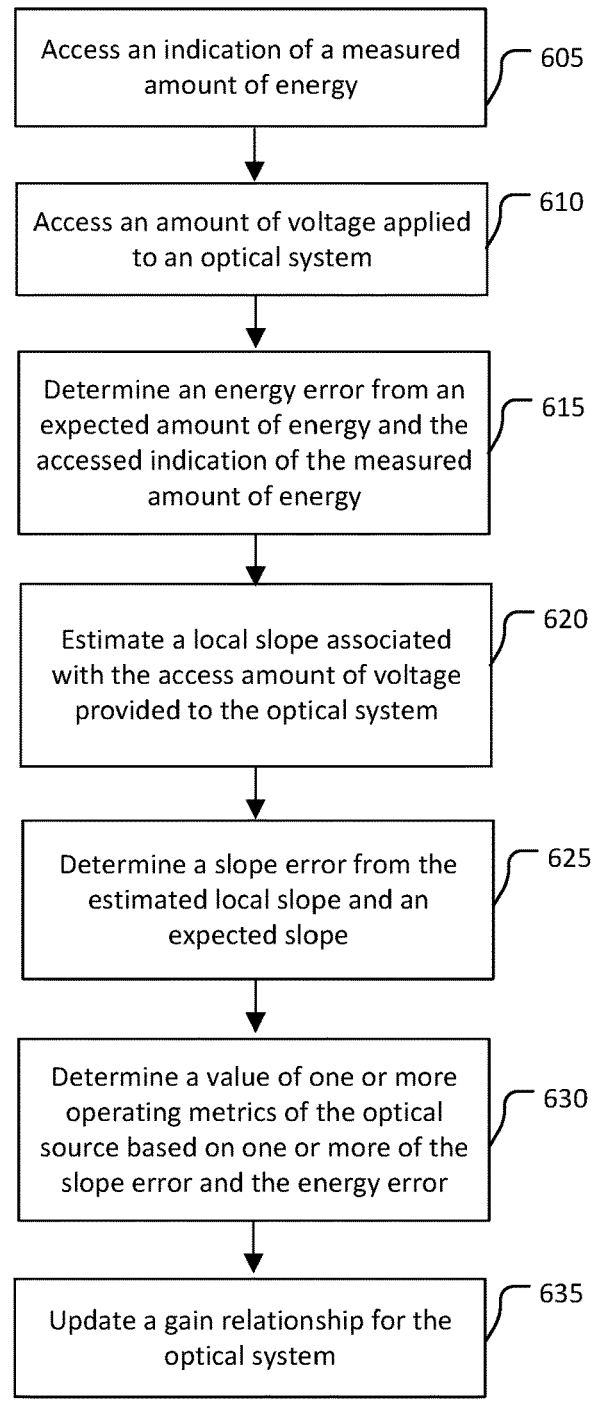
FIG. 6 is a flow chart of an exemplary process for controlling an optical source in an photolithography system.
Figure 7A:
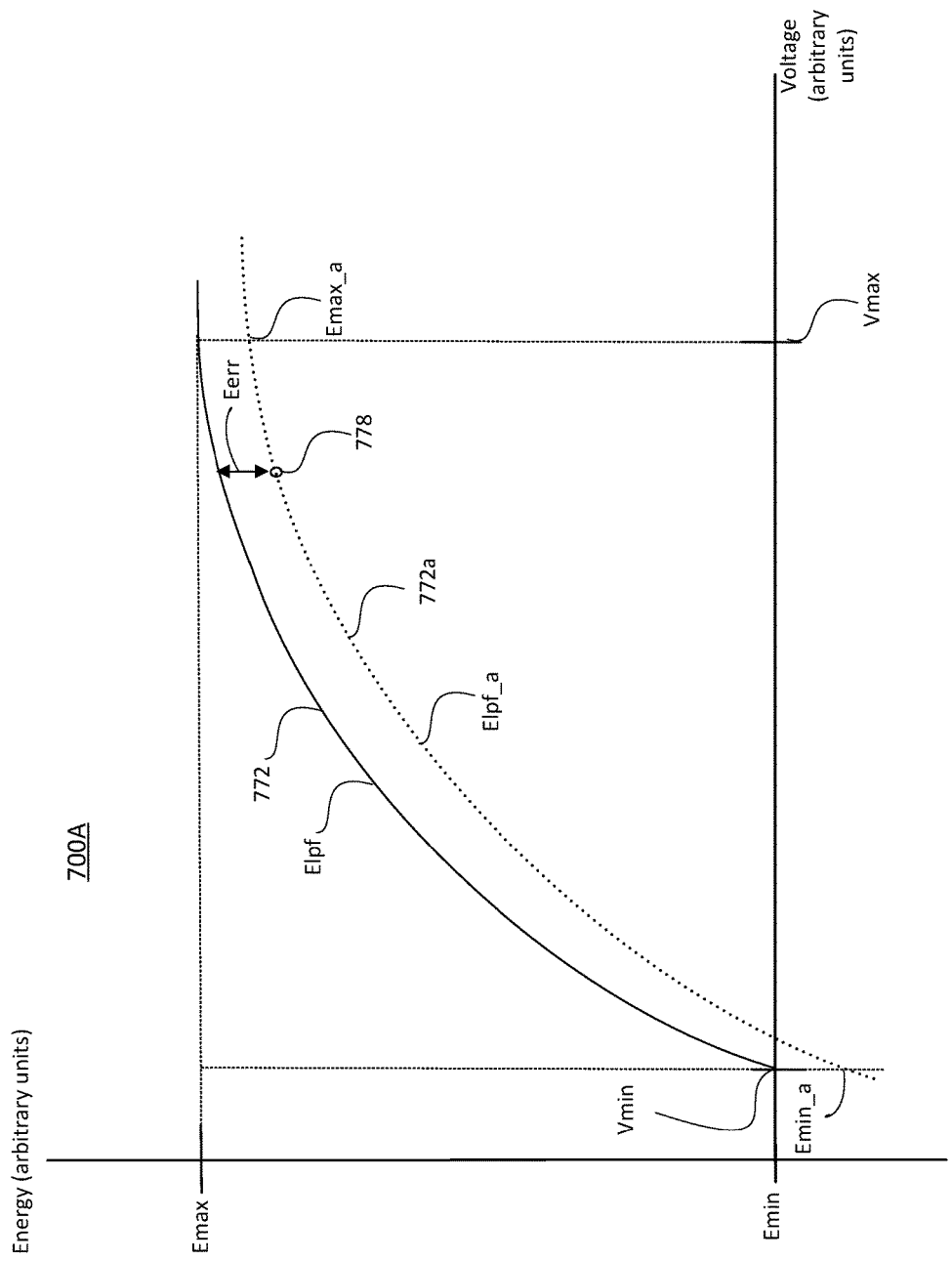
Figure 7B:
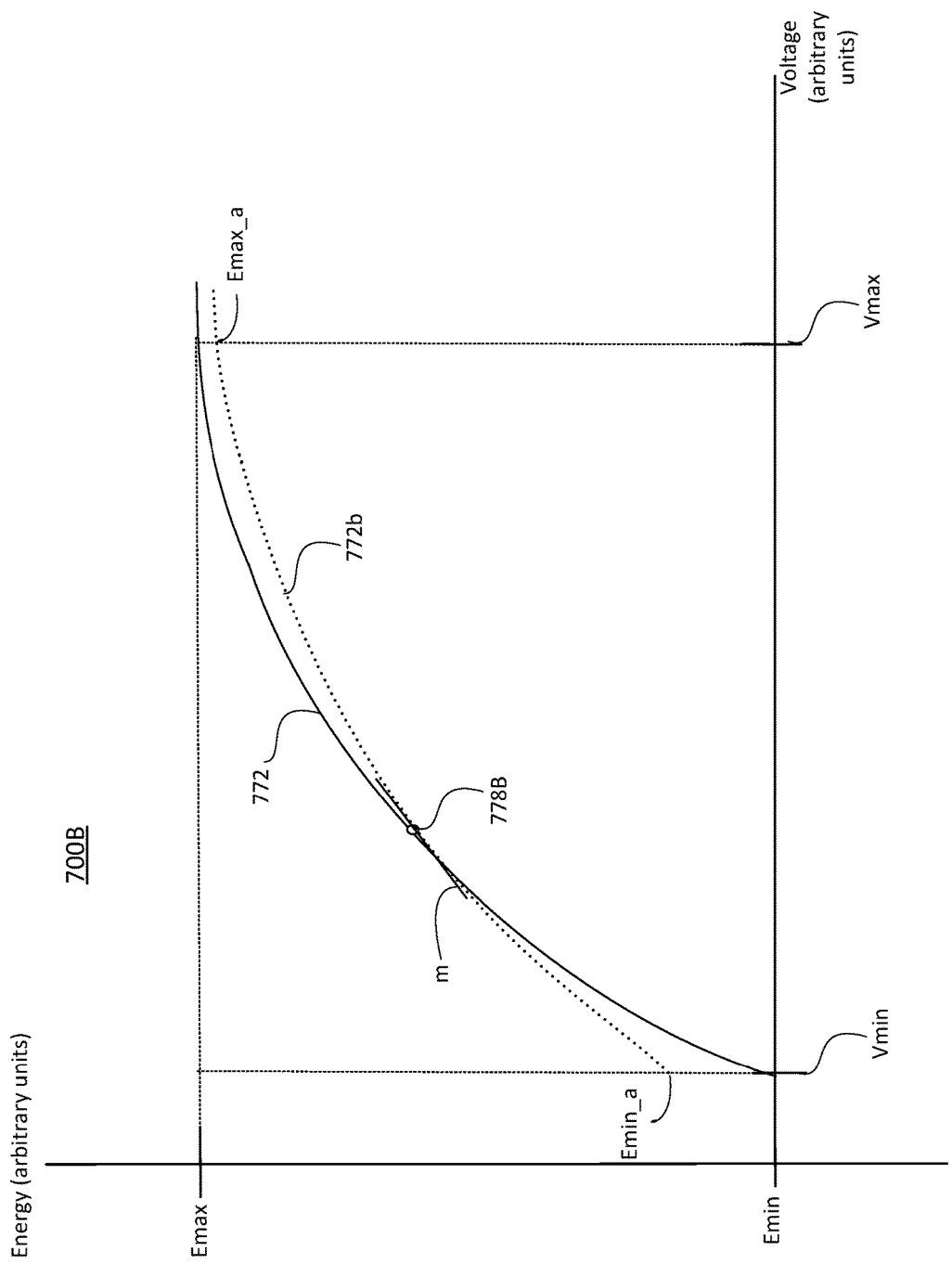

FIG. 6 is a flow chart of an exemplary process 600 for controlling an optical source, such as the optical source 105 or the optical source 205. The optical source may be a subsystem of an optical source, such as the master oscillator 212 or the power amplifier 230. The example process 600 may be performed, for example, by the control system 150 or the control system 550. The process 600 is discussed with respect to the optical system 500 of FIG. 5. In the discussion of the process 600, the pulses of the light beam 560 are indexed by (i). Thus, for a pulse i, the pulse i−1 is the pulse that occurs immediately before the pulse i in time and the pulse i+1 is the pulse that occurs immediately after the pulse i in time. An instance of the control signal 552 denoted 552(i) is the control signal 552 that is applied to the optical source 505 to produce the $i^{th}$ pulse. An instance of the control signal 551 denoted 551(i) is the control signal 551 is the control signal 551 that is received after the i$^{th}$ pulse has reached the lithography exposure apparatus 115.

The control system 550 accesses an indication of an amount of energy produced by the optical system (605). In some implementations, the accessed indication of the amount of energy may be an energy of a pulse that has entered the lithography exposure apparatus 115 and exposes the wafer 120. In these implementations, the accessed indication is an indication of an amount of energy measured at the detector 122. The control system may access the indication of the amount of energy measured at the detector 122 by receiving an instance of the control signal 151 (such as the control signal 551(i)) and processing the signal to extract the data that indicates the amount of received energy.

The accessed indication of an amount of energy may be an indication of an amount of energy elsewhere in the lithography system. For example, in some implementations, the indication of an amount of energy produced by the optical system may be an indication of an amount of energy in a pulse emitted from the optical source 505 that has not entered the lithography exposure apparatus 115. In these implementations, the indication of an amount of energy may come from a sensor or detector that receives a portion of a pulse as the pulse propagates toward the lithography exposure apparatus 115. In some implementations, the indication of an amount of energy produced by the optical source 505 may be an indication of an amount of energy measured within the optical source 505.

The control system 550 accesses an amount of voltage applied to the optical source 505 (610). For example, the control system 550 may access an amount of voltage applied to the optical source 505 and/or a component of the optical source 505 associated with the measured amount of energy. The voltage associated with the measured amount of energy is the voltage that was applied to the optical source to produce the energy that was measured. In this example, the measured energy is from pulse i, and the voltage applied to the optical source 505 that is associated with the measured energy is the voltage that is indicated by the control signal 552 (i). The amount of measured energy and the amount of applied voltage represent a measured operating point (V(i), E(i)) of the optical source 505, where V(i) is the voltage applied to produce pulse i and E(i) is the measured energy of pulse i. The measured operating point values V(i) and E(i) may be stored in the buffer 556 or the electronic storage 557. The buffer 556 accumulates a measured operating point value for each of a plurality of pulses, and may store the measured operating point value for each pulse produced by the optical source 505. In some implementations, the buffer 556 may store the measured operating points of 50 pulses.

Additionally, the measured operating point values stored in the buffer 556 may be low-pass filtered to remove any measured operating points that differ greatly from the other measured operating points. For example, applying a low-pass filter may remove or smooth out measured operating points that have an energy near $E_{max}$. Operating points that have an energy near or at $E_{max}$ may be indicative of an error condition. Furthermore, the measured values may be high-pass filtered. Applying a high-pass filter may remove the effects of slow drifts in the energy or voltage. Thus, filtering the data in the buffer 556 may remove or reduce the impact of measured operating points obtained in an error condition.

Different filters may be used for the compensation module 554 (which estimates the gain relationship of the optical source 505 based on Equation (1)) and the gain estimator 555 (which estimates a slope of the gain relationship at an operating point of the optical source 505 using data stored in the buffer 556). A low-pass filter may be applied to the data used in the compensation module 554 and a high-pass filter may be applied to the data used in the gain estimator 555. Equation (6) is an example of a low-pass filter that may be applied to the data stored in the buffer 556. Equations (7) and (8) are examples of the Equation (6) is an example of a low-pass filter structure to determine a low-pass filter voltage $V_{lpf}$ based on a measured voltage (V):

$$V_{lpf}(i)=V_{lpf}(i-1)+FG*(V(i)-V_{lpf}(i-1)) \quad \text{Equation (6)},$$

where $V_{lpf}(i)$ is the low-pass filtered voltage for pulse i, $V_{lpf}(i-1)$ is the low-pass filter voltage for the pulse i−1 (thus, this value is previously computed and known), V(i) is the measured voltage for pulse i, and FG is the filter gain. FG is an adjustable and known numerical value that is a parameter of the low-pass filter. The low-pass filter of Equation (6) may help reduce the effect of noise and atypical measurements. For example, the low-pass filter of Equation (6) may reduce the effect of a measured voltage that is much larger than the measured voltages associated with other pulses. When estimating the coefficients a, b, c, and d using Equations (2)-(5), the low-pass filtered voltage $V_{lpf}$ may be used instead of the measured voltage V. The low-pass filtered energy $E_{lpf}$ is the energy predicted by the model of Equation (1) for $V=V_{lpf}$.

Additionally, the measured voltage and energy values may be high-pass filtered. Equations (7) and (8) are examples of a high-pass filter structure that may be used to high-pass filter the measured voltage and energy values:

$$V_{hpf}(i)=FG*V_{hpf}(i-1)+(V(i)-V(i-1)) \quad \text{Equation (7)},$$

where $V_{hpf}(i)$ is the high-pass voltage value for pulse i, $V_{hpf}(i-1)$ is the high-pass voltage value for the pulse i−1 (thus, this value is previously computed and known), V(i) is the measured voltage for pulse i, FG is the filter gain, and V(i−1) is the measured voltage for pulse i−1. The filter gain for the high-pass filter may be different than the filter gain for the low-pass filter. Equation (8) is as follows:

$$E_{hpf}(i)=FG*E_{hpf}(i-1)+(E(i)-E(i-1)) \quad \text{Equation (8)},$$

where $E_{hpf}(i)$ is the high-pass filtered energy value for pulse i, $E_{hpf}(i-1)$ is the high-pass filtered energy value for the pulse i−1 (thus, this value is previously computed and known), FG is the filter gain, E(i) is the measured energy for pulse i, and E(i−1) is the measured energy for pulse i−1.

High-pass filters (such as the high-pass filter of Equations (7) and (8)) may help prevent the presence of slow drifts in measured energy and/or voltage from corrupting estimates of the gain relationship. As shown in Equations (7) and (8), the same high-pass filter structure may be used to high-pass filter the energy and the voltage. The high-pass filtered voltage and/or energy values may be stored, for example, in the buffer 556 and/or the electronic storage 557.

An energy error is determined from an expected amount of energy and the measured amount of energy (615). The expected amount of energy Eo(i) is an amount of energy estimated by the compensation module 554 using Equation (1) and the accessed amount of voltage V(i). In other words, the expected amount of energy Eo(i) is the amount of energy predicted by the gain relationship, as expressed by Equation (1) with V of Equation (1) being V(i), which represents the amount of voltage that was actually applied to the electrodes of the optical source 505 to produce the pulse i. The coefficients a, b, c, and d of the model expressed in Equation (1) are determined as discussed with respect to FIG. 5. The energy error $E_{err}(i)$ for the pulse i is determined by comparing the expected amount of energy Eo(i) and the measured amount of energy E(i). For example, the energy error $E_{err}$ may be the difference between the expected amount of energy and the measured amount of energy, as shown in Equation (9):

$$E_{err} = E - Eo \qquad \text{Equation (9),}$$

where E is the measured amount of energy and Eo is the predicted or expected amount of energy based on Equation (1).

An estimated local slope of the gain relationship at (E(i),V(i)), which is the measured operating point of the optical source 505 that produced the pulse i, is estimated based on measured values (620). The estimated local slope of the gain relationship may be estimated by the gain estimator 555. The estimated local slope may be estimated using input values that span a portion of the total input range, and the portion may be 10% or less of the total input range of the optical source. The slope of the gain relationship at (E(i), V(i)) is represented by m(i). The local slope m is determined by the gain estimator 555 and is based on the operating point data stored in the buffer 556. The operating point data stored in the buffer 556 may be voltage and energy values that have been high-pass filtered according to Equations (7) and (8), respectively. Referring also to FIG. 4, the local slope m is assumed to be linear. The local slope m is estimated using data for N pulses (index as i) based on Equation (10):

$$m = \frac{\sum e_i v_i - \sum v_i \sum i}{N \sum v_i v_i - (\sum v_i)^2}, \qquad \text{Equation (10)}$$

where $e_i$ and $v_i$ are the high-pass filtered voltage and energy values determined in Equations (8) and (7), respectively, and stored in the buffer 556 and N is the number of samples from the buffer 556. For example, N may be 50. The local slope m may be estimated using all or a portion of the data in the buffer 556. For example, the local slope m may be estimated using only operating point values that have a voltage and/or energy value that are sufficiently close to the current measured voltage and energy values, V(i) and E(i). For example, the local slope m may be estimated using operating point values where the absolute value of the difference between the voltage of the operating point and V(i) is no more than a pre-determine threshold to help ensure that the estimated local slope is accurate.

A slope error is determined from the estimated local slope m and an expected slope $m_o$ (625). The expected slope $m_o$ is determined from the first derivative of the model of Equation (1), setting $V = V_{lpf}$. The first derivative of the gain relationship is expressed in Equation (11):

$$m_o = \frac{dE}{dV}(V) = 3aV^2 + 2bV + c, \qquad \text{Equation (11)}$$

where V is the voltage at which the expected slope is to be determined, $m_o$ is the expected or predicted slope at the voltage V, and the coefficients a, b, and c are determined as discussed with respect to FIG. 5. In this example, $V = V_{lpf}(i)$, which is the low-pass filtered value of the voltage applied to the electrodes to produce pulse (i) from Equation (6), and the expected slope is $m_o(i)$, which is the expected slope at the operating point ($V_{lpf}(i)$, $E_{lpf}(i)$) associated with pulse i.

The slope error $m_{err}$ may be determined by comparing the estimated local slope m(i) and the expected slope $m_o(i)$. For example, $m_{err}$ may be the difference between the estimated local slope m(i) and the expected slope $m_o(i)$, as expressed by Equation (12):

$$m_{err} = m - mo \qquad \text{Equation (12),}$$

where m is the estimated slope at an operating point of the optical source 505, and $m_o$ is the expected slope at that operating point. Continuing the example above, for the operating point ($V_{lpf}(i)$, $E_{lpf}(i)$), m is m(i) and $m_o$ is $m_o(i)$.

A value of one or more operating metrics is determined based on one or more of the slope error and the energy error (630). The gain relationship of the optical system 505 is updated (635). The updated gain relationship relates the full range of input values to corresponding output values.

The operating metrics are any parameter associated with the gain relationship of the optical source 505 that may change over time as the source 505 operates and produces the beam 160. The operating metrics may be, for example, $E_{min}$ and $E_{max}$, which are the energies produced when the minimum and maximum voltages, respectively, are applied to the optical source 505. The value of the operating metric is adapted or changed over time based on data measured from the optical source 505. The value of the operating metrics may be determined by the adaptation module 553 and provided to the compensation module 554. The compensation module 554 uses the determined value of the operating metrics to update the gain relationship of the optical source 505. For example, the determined operating metrics may be used to determine updated or current values for the coefficients of Equation (1) with the updated or current values of the operating metrics being used in Equations (2)-(5). In this way, the adaptation module 554 provides data to the compensation module 553 that allows the estimate of the gain relationship to adapt over time.

A set of heuristics or conditions may be used to determine how to adapt the operating metrics. The heuristics may be based on, for example, known performance of the optical source 505 and/or the past performance process 600. The heuristics may evaluate the applied voltage V(i), the low-pass filtered voltage $V_{lpf}$, the local slope m, the expected or predicted slope $m_o$, and/or the slope error $m_{err}$ to determine an adjustment or adaptation of the value of an operating metric or metrics. For example, the heuristics may be determined based on whether or not the gain estimator 555 is producing an estimate of the slope that has converged or is likely to be close to the actual slope. To determine whether the gain estimator 555 has converged, the measured voltage V(i) is compared to the low-pass filtered voltage $V_{lpf}$, and the slope error $m_{err}$ is compared to a threshold. As discussed above, the low-pass filter acts to remove voltages that are away from the nominal operating voltage. If the difference between the low-pass filtered voltage and the measured voltage is above a threshold, then the measured voltage V(i) is likely to be an outlier, and it is likely that the estimate of the gain estimator 555 has not converged. Similarly, if absolute value of $m_{err}$ is above a threshold then it is likely that the estimate of the gain estimator 555 has not converged. In these instances, the energy error (Err) of Equation (9) is used to update the gain relationship. For example, and referring to FIG. 7A, the energy error $E_{err}$ determined from an operating point 778 is used to adapt the operating metrics $E_{max}$, $E_{min}$ and $E_{lpf}$ and shift the gain relationship 772 such that an updated gain relationship 772a predicts an energy that equals E(i) at the measured voltage V(i). In this example, the operating metric $E_{max}$ is adapted to $E_{max\_a}$, $E_{min}$ is adapted to $E_{min\_a}$, and $E_{lpf}$ is adapted to $E_{lpf}a$.

If the difference is below the threshold, the gain estimator 555 is likely to have converged, and is likely to provide more reliable information compared to direct voltage measurements. When the gain estimator 555 is likely to have converged, the slope error $m_{err}$ and the estimated local slope m of Equation (12) is used to adapt the operating metrics $E_{max}$ and $E_{min}$. For example, and referring to FIG. 7B, the slope of the gain relationship at an operating point $(V_{lpf}, E_{lpf})$ shown as 778B may be set based on the slope error $m_{err}$ and the estimated local slope m. The threshold for comparing the absolute value of the difference between the measured voltage V(i) and the low-pass filtered measured voltage $V_{lpf}$ may be determined from observing the optical source 505 or from properties of the optical source 505, such as the total possible range of voltages that may be applied to the optical source 505.

Other heuristics may be used instead of or in addition to the heuristic based on the difference between the measured voltage V(i) and the low-pass filtered voltage $V_{lpf}$. For example, the heuristics may be based on a stipulation that the estimated slope $m_o$ decreases with increasing input voltage.

Figure 8:
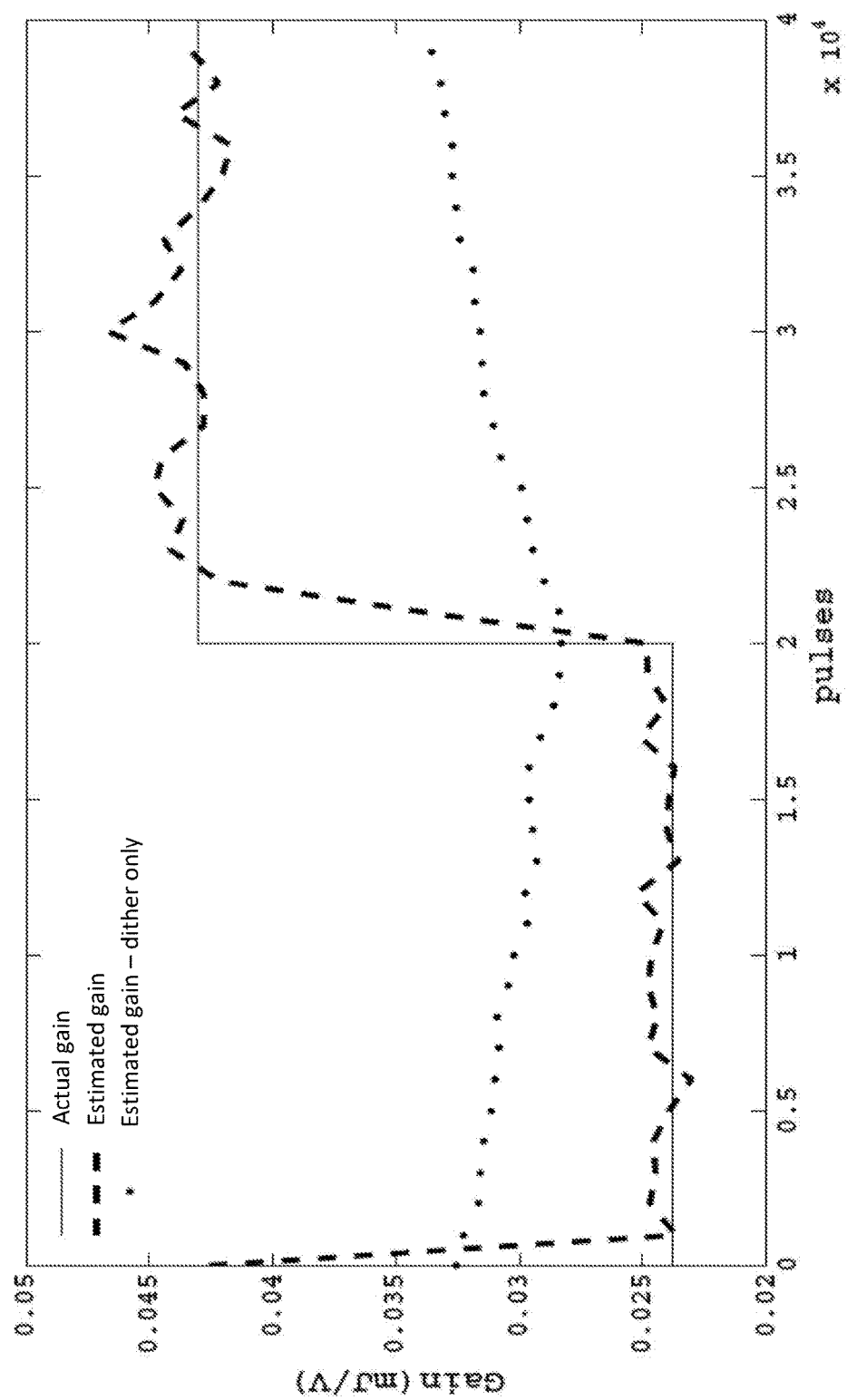
FIG. 8 is a plot of exemplary simulated gain as a function of pulse number for an optical source that produces a pulsed light beam.

Referring to FIG. 8, a graph 800 shows a plot of an exemplary estimated slope (or gain) of the optical source 505 as a function of pulse number obtained through simulation of the control system 150. The graph includes a gain estimated using a dither-only technique (shown with the dotted line), a gain $m_o$ estimated using the process 600 (shown with the dashed line), and a measured gain (shown with the solid line). As shown in FIG. 8, compared to the technique that only uses a dither to estimate gain, the gain estimated using the process 600 is closer to the measured gain over the entire burst of pulses and is also more constant over the entire burst of pulses. Moreover, the gain estimated using the process 600 also adapts more quickly to a change in the system that results in the change in the true gain at pulse 20,000. As shown in the graph 800, the gain estimated using the process 600 is close to the true, measured gain after about 200 pulses. The gain estimated using dither-only does not adapt as readily to the change.

Other implementations are within the scope of the claims. For example, the process 600 may be used in a legacy system that includes a dither signal to estimate the gain relationship, even if it is unknown a priori that the dither signal is used and without making changes to the existing dither signal. In these implementations, the dither signal, which may be a voltage signal applied to the optical source, is reflected as part of the measured output of the optical source and is thus accounted for in the process 600 discussed above.

What is claimed is:

1. A method comprising:
   accessing an indication of an output of an optical source of a photolithography system, the optical source being associated with a range of input values and a corresponding range of output values, the correspondence between the range of input values and the corresponding range of output values being based on an initial gain relationship;
   accessing an indication of an input provided to the optical source of the photolithography system, the provided input being associated with the accessed indication of the output of the optical source;
   determining an output error from an expected amount of output and the accessed indication of the output of the optical source;
   estimating a local gain associated with the accessed indication of the input provided to the optical source;
   determining a gain error from the estimated local gain and an expected local gain;
   estimating a current value of one or more operating metrics of the optical source based on the output error and/or the gain error; and
   updating the initial gain relationship for the optical source based on the estimated current value of the one or more operating metrics to determine an updated gain relationship for the optical source, the updated gain relationship relating the range of input values to a corresponding range of expected output values.

2. The method of claim 1, wherein
   the input values comprise voltage values,
   the output values comprise energy values, and
   the one or more operating metrics comprise a minimum output energy and a maximum output energy, the minimum output energy being an amount of energy produced by the optical source in response to application of a minimum voltage input, the maximum output energy being an amount of energy produced by the optical source in response to application of a maximum input voltage.

3. The method of claim 2, wherein each of the initial gain relationship and the updated gain relationship comprises a third-order polynomial defined by four coefficients, and further comprising:
   determining a value for each of the four coefficients of the updated gain relationship based on the accessed indication of the output of the optical source, the accessed indication of the output of the optical source, an assumed slope of the updated gain relationship at a maximum input of the optical source, an assumed minimum input value, an assumed maximum input value, and the estimated current value of the one or more operating metrics.

4. The method of claim 2, further comprising:
   determining the expected amount of output from the initial gain relationship, each of the updated gain relationship and the initial gain relationship comprises a third-order polynomial defined by four coefficients; and
   determining a value for each of the four coefficients of the updated gain relationship based on the accessed indication of the output of the optical source, the accessed indication of the output of the optical source, an assumed slope of the updated gain relationship at a maximum input of the optical source, the assumed minimum input value, the assumed maximum input value, and a known value of the one or more operating metrics.

5. The method of claim 4, wherein the known value of one or more operating metrics is either an assumed value or a previously determined value.

6. The method of claim 4, further comprising determining the expected local gain from the initial gain relationship and the accessed indication of the input provided to the optical source.

7. The method of claim 6, wherein determining the expected amount of local gain comprises using a gain estimator, the gain estimator comprising a buffer configured to store gain data, the gain data comprising a plurality of operating points of the optical source, each operating point comprising an input provided to the optical source and a corresponding output of the optical source.

8. The method of claim 7, wherein each of the plurality of operating points comprises an amount of voltage provided to the optical source and a measured amount of energy at a sensor in a lithography exposure apparatus.

9. The method of claim 7, wherein determining the expected amount of local gain using the gain estimator comprises determining a slope of a line that represents a linear relationship between at least some of the voltage amounts and the corresponding amounts of measured energy stored in the buffer.

10. The method of claim 1, further comprising:
determining an input to provide to the optical source using the updated gain relationship;
generating a signal that represents the determined input to provide to the optical source; and
providing the generated signal to the optical source.

11. The method of claim 1, further comprising:
filtering the accessed indication of the output to generate a filtered output; and
filtering the accessed indication of an input to generate a filtered input, wherein
determining an output error comprises determining an output error based on the filtered output and the expected amount of output.

12. The method of claim 1, wherein the optical source is configured to emit a pulsed light beam, and the gain relationship is updated for each pulse in a plurality of temporally successive pulses in the light beam such that an instance of the updated gain relationship is determined for each pulse.

13. A method of controlling an optical source in a photolithography system, the method comprising:
receiving an indication of a measured value associated with an output metric of the optical source, the measured value being related to an energy in a pulse of light produced by the optical source;
accessing a value of an operating metric associated with the optical source;
estimating a relationship between the output metric and an input metric based on the indication of the measured value of the output metric and the value of the operating metric, the input metric being related to an amount of excitation applied to the optical source;
determining an expected value of the output metric from the estimated relationship;
comparing the indication of the measured value and the expected value to determine an error metric;
adjusting the value of the operating metric and the estimated relationship based on the determined error metric;
adjusting a value of the input metric associated with the optical source based on the adjusted estimated relationship; and
providing the adjusted value of the input metric to the optical source, wherein the estimated relationship between the output metric and the input metric is adjusted for each of a plurality of optical pulses emitted from the optical source, the plurality of pulses comprising at least some pulses that are temporally successive.

14. The method of claim 13, wherein the output metric comprises an energy of an optical pulse emitted from the optical source, and the input metric comprises an amount of voltage configured to be applied to a component of the optical source.

15. The method of claim 14, wherein the indication of a measured energy of the optical pulse emitted from the optical source is an energy measured at a wafer exposed by a lithography exposure apparatus of the photolithography system, and the indication of the measured energy is received from the lithography exposure apparatus.

16. The method of claim 13, wherein accessing a value of an operating metric comprises accessing a value of a minimum output energy and a maximum output energy, the minimum output energy being an amount of energy produced by the optical source in response to application of a minimum voltage input, the maximum output energy being an amount of energy produced by the optical source in response to application of a maximum input voltage.

17. A photolithography system comprising:
an optical source configured to emit a pulsed light beam;
a lithography exposure apparatus comprising an optical system, the optical system being positioned to receive the pulsed light beam from the optical source at a first side of the optical system and to emit the pulsed light beam at a second side of the optical system; and
a control system coupled to the optical source and the lithography exposure apparatus, the control system configured to:
access a value of an operating metric associated with the optical source;
estimate one or more parameters that define a gain relationship between an output metric and an input metric of the optical source based on an indication of a measured energy and the value of the operating metric;
determine an expected value of the output metric from the gain relationship;
compare the indication of the measured energy and the expected value to determine an error metric;
adjust the value of the operating metric and the gain relationship based on the determined error metric;
adjust a value of the input metric associated with the optical source based on the adjusted gain relationship; and
provide the adjusted value of the input metric to the optical source.

18. The photolithography system of claim 17, wherein the input metric comprises an amount of voltage, and the control system configured to apply the adjusted value of the input metric to the optical source comprises the control system being configured to provide a signal comprising information indicating the amount of voltage to be applied to a component of the optical source.

19. The photolithography system of claim 17, wherein the optical source comprises: electrodes and a gain medium, and wherein the control system is configured to provide a signal comprising information indicating the amount of voltage to be applied to the electrodes of the optical source.

20. The photolithography system of claim 17, wherein the lithography exposure apparatus is configured to receive a wafer at the second side of the optical system and further comprising a sensor at the second side of the optical system of the lithography exposure apparatus, the sensor configured to measure an amount of optical energy at the second side of the optical system and to provide the indication of the measured amount of energy at the second side of the optical system to the control system.

21. The photolithography system of claim 17, wherein the optical source comprises a master oscillator and a power amplifier, the master oscillator being configured to provide a seed light beam to the power amplifier, and the power amplifier being configured to optically amplify the seed light beam to produce the pulsed light beam.

22. The photolithography system of claim 17, wherein the optical source comprises at least one discharge chamber comprising a gas mixture, the gas mixture being configured to emit light at a wavelength between about 193 nanometers (nm) and 351 nm.

* * * * *